United States Patent [19]
Scott

[11] Patent Number: 6,160,834
[45] Date of Patent: Dec. 12, 2000

[54] VERTICAL CAVITY SURFACE EMITTING LASERS WITH CONSISTENT SLOPE EFFICIENCIES

[75] Inventor: Jeffrey W. Scott, Boulder, Colo.

[73] Assignee: Cielo Communications, Inc., Broomfield, Colo.

[21] Appl. No.: 09/237,580

[22] Filed: Jan. 25, 1999

Related U.S. Application Data

[60] Provisional application No. 60/108,470, Nov. 14, 1998.

[51] Int. Cl.$^7$ .................................................. H01S 3/085
[52] U.S. Cl. .......................... 372/96; 372/49; 372/20; 372/99
[58] Field of Search .............................. 372/20, 45, 49, 372/50, 96, 99

[56] References Cited

U.S. PATENT DOCUMENTS

| | | | |
|---|---|---|---|
| 5,343,487 | 8/1994 | Scott et al. | 372/46 |
| 5,397,739 | 3/1995 | Chalmers et al. | 437/129 |
| 5,483,511 | 1/1996 | Jewell et al. | 369/44.37 |
| 5,521,736 | 5/1996 | Swirhun | 359/158 |
| 5,577,064 | 11/1996 | Swirhun et al. | 372/96 |
| 5,594,751 | 1/1997 | Scott | 372/46 |
| 5,606,572 | 2/1997 | Swirhun et al. | 372/96 |
| 5,642,376 | 6/1997 | Olbright et al. | 372/99 |
| 5,757,837 | 5/1998 | Lim et al. | 372/50 |
| 5,812,582 | 9/1998 | Gilliland et al. | 372/50 |
| 5,976,903 | 11/1999 | Lee et al. | 372/20 |

FOREIGN PATENT DOCUMENTS 820131 1/1998 European Pat. Off. .

OTHER PUBLICATIONS

Jeffrey W. Scott, Design, Fabrication and Characterization of High–Speed Intra–Cavity Contacted Vertical–Cavity Lasers, Jun. 1995. ECE Technical Report #95–06, Department of Electrical Computer Enginnering, University of California Santa Barbara.

Jeffrey W. Scott, "Vertical–cavity Lasers Facilitate Gigabit Communications," *Laser Focus World*, Oct. 1998, 3 pages.

*Primary Examiner*—James W. Davie
*Attorney, Agent, or Firm*—Christie Parker & Hale LLP

[57] ABSTRACT

A vertical cavity surface emitting laser (VCSEL) with variable tuning layer for adjusting the slope of the laser and method for manufacturing the same are disclosed. In practice, a VCSEL wafer is grown by any conventional technique, and fabricated into discrete lasers while maintained in wafer form. The initial lasers are then tested to determine characteristics, such as the slope efficiency distribution. A variable thickness dielectric layer is then deposited which is calculated to tune the slope efficiency distribution to within a target specification by altering the phase of the top facet reflectivity of the initial lasers. The resulting change in transmission directly changes the laser slope in a predictable fashion. The tuning step may be repeated, if necessary, to further refine the slope to the desired value. The method produces VCSELs with similar or consistent slopes from a plurality of wafers. Also disclosed are an optical subassembly and optical transceiver incorporating the improved VCSELs.

61 Claims, 10 Drawing Sheets

Includes SiO$_2$ phase match

---
| | | |
|---|---|---|
| SiO$_2$ | 800 Å | 40% transmission increase in air |
---
| Si$_3$N$_4$ | 1056 Å | quarter wavelength |
| SiO$_2$ | 1457 Å | quarter wavelength |

3 periods of the above layers

---
| Si$_3$N$_4$ | 2113 Å | half wavelength |

CONVENTIONAL VCSEL SUBSTRATE

VERTICAL CAVITY SURFACE EMITTING LASERS WITH CONSISTENT SLOPE EFFICIENCIES

CROSS-REFERENCE TO RELATED APPLICATION

This application claims the benefit of U.S. provisional patent Application Ser. No. 60/108,470, filed Nov. 14, 1998, the contents of which are hereby incorporated by reference.

FIELD OF THE INVENTION

This application relates generally to semiconductor lasers, and in particular to vertical cavity surface emitting lasers (VCSELs) with consistent slope efficiencies and a method of fabricating the same that allows the slope of the lasers to be predictably tuned during fabrication.

BACKGROUND OF THE INVENTION

Semiconductor lasers are widely used in applications such as optical communications. The edge emitting laser diode is a semiconductor laser that emits light from a plane which is a continuation of the p-n junction of the diode. Cleaved surfaces at the ends of the diode act as mirrors which together define an optical cavity. Optical feedback provided by the cleaved mirrors creates a resonance of the emitted light that results in lasing.

The vertical cavity surface emitting laser (VCSEL) is another type of semiconductor laser in which the optical cavity is normal to the p-n junction of the semiconductor wafer from which it was fabricated. Ordinarily VCSELs are manufactured with many layers of semiconductor material deposited upon the substrate. The VCSEL includes highly reflective optical mirrors above and below the active layer which, in contrast to the edge emitting laser, enable laser output normal to the surface of the wafer.

VCSELs are preferred over edge-emitting devices for a number of applications. Since they emit vertically and the beam is more symmetric and less divergent, coupling VCSELs to fiber or to other optical devices is easier in many cases. Typically a low-cost ball lens may be used rather than expensive aspheres. In addition, VCSELs are fabricated into completed lasers at the wafer level, so fabrication and testing are relatively inexpensive. These properties, combined with the small size of the VCSEL that allows high speed operation at low currents, make them desirable for lower-cost data communications transceivers.

Because of their complexity, however, existing processes for manufacturing VCSELs do not always yield devices with consistent characteristics. The process involves hundreds of layers that depend on numerous parameters including, but not limited to, doping concentration, substrate temperature, material sources, and growth rate. These process parameters compound the manufacturing difficulty already well understood in the semiconductor field where fluctuations on the order of 50–100% are not uncommon. In the case of silicon technology, designers typically use ratios of values to minimize the effect of process variations. Unfortunately, in the case of discrete lasers, there is no suitable existing way to compensate for process variations within the device. The result is that the burden is placed on the higher level assemblies to compensate for device variations, adding complexity and cost.

In the case of data communications, for example, the output power of the transmitter is ordinarily restricted to a specified range. In practice, either the total optical subassembly slope variation falls within specification, or the drive circuit must compensate by driving low slopes with higher currents and higher slopes with lower currents. The drawback with varying the drive currents, however, is that high speed performance varies, affecting the overall product consistency and yield.

Accordingly, a process would be desirable that produces lasers with highly consistent slope efficiencies on a wafer to wafer basis. Slope efficiency, also referred to as external efficiency, or slope, generally refers to the product of the internal efficiency and the optical efficiency. The internal efficiency is the fraction of electrons that are converted to photons, and the optical efficiency is the fraction of photons that are transmitted out of the laser. Since internal efficiency is difficult to precisely control because of the complexity of semiconductor processes, those skilled in the art would prefer a process that enables the tuning of the slope efficiency of the laser by altering the optical efficiency, which is directly related to the transmission and reflectivity of the laser, to compensate for process variations in a relatively simple and cost effective manner.

Figure 12:
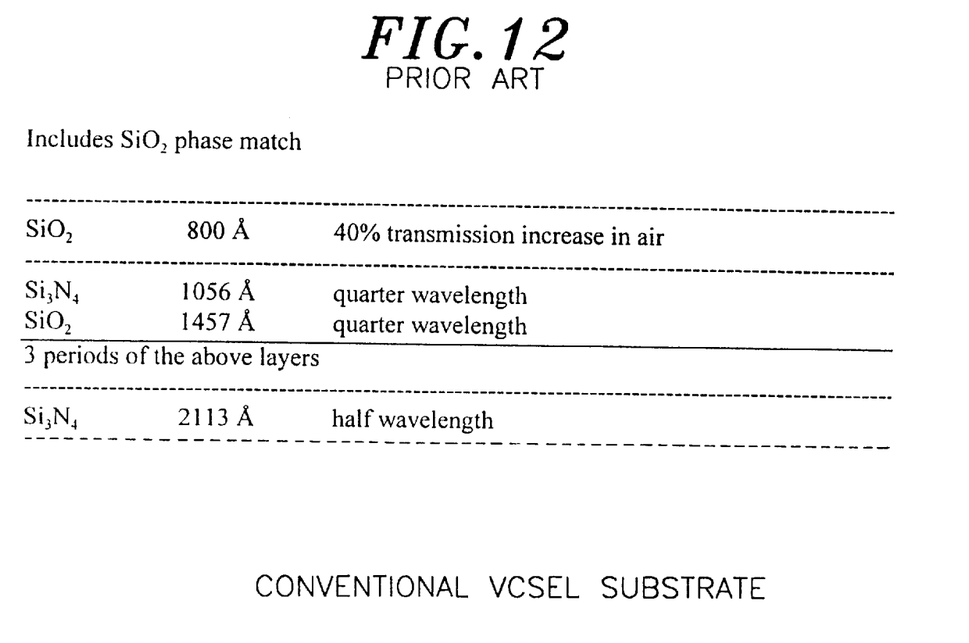
FIG. 12 is a specification for a prior art VCSEL.

Some prior art lasers have been fabricated with a non-quarter wavelength layer of optically transparent material that had the side effect of changing the slope. An example of such a prior art VCSEL with a non-quarter wavelength layer has the specification shown in FIG. 12. However, the prior art process changed the slope of the laser in a fixed manner that generally did not take into account wafer to wafer variations. Therefore, any wafer to wafer variations upon application of the fixed layer led to the same variations in the final products. Those skilled in the art would prefer a process that enables predictable tuning during fabrication to achieve lasers having consistent slopes on a wafer to wafer basis.

SUMMARY OF THE INVENTION

There is therefore provided in a presently preferred embodiment of the present invention a VCSEL having a variable tuning layer for predictably adjusting the optical efficiency of the laser during fabrication to achieve lasers with substantially similar slopes on a wafer to wafer basis.

To fabricate the VCSEL with variable tuning layer according to one embodiment of the present invention, a VCSEL wafer is grown by any of a variety of conventional techniques, and fabricated into discrete lasers or laser arrays while maintained in wafer form. The initial lasers are then tested by any conventional technique, preferably on a representative sample, to determine characteristics of the initial lasers, such as the slope efficiency distribution. A variable thickness dielectric layer is then deposited which is calculated to tune the slope efficiency distribution to within the target specification. The variable tuning layer changes the laser optical efficiency by altering the phase of the top facet reflectivity. The change in transmission by the altered reflectivity directly changes the laser slope in a predictable fashion. Once the variable tuning layer is deposited, vias are preferably etched for electrical contact to enable additional measurements to be performed. Based on the tests, the tuning step may be repeated, if necessary, to further refine the slope to the desired value. The process produces VCSELs with similar or consistent slopes from a plurality of wafers.

BRIEF DESCRIPTION OF THE DRAWINGS

These and other features of the present invention will be better understood from the following detailed description read in light of the accompanying drawings, wherein like reference numerals are used to describe like structures, and wherein.

DETAILED DESCRIPTION OF THE INVENTION

Figure 1:
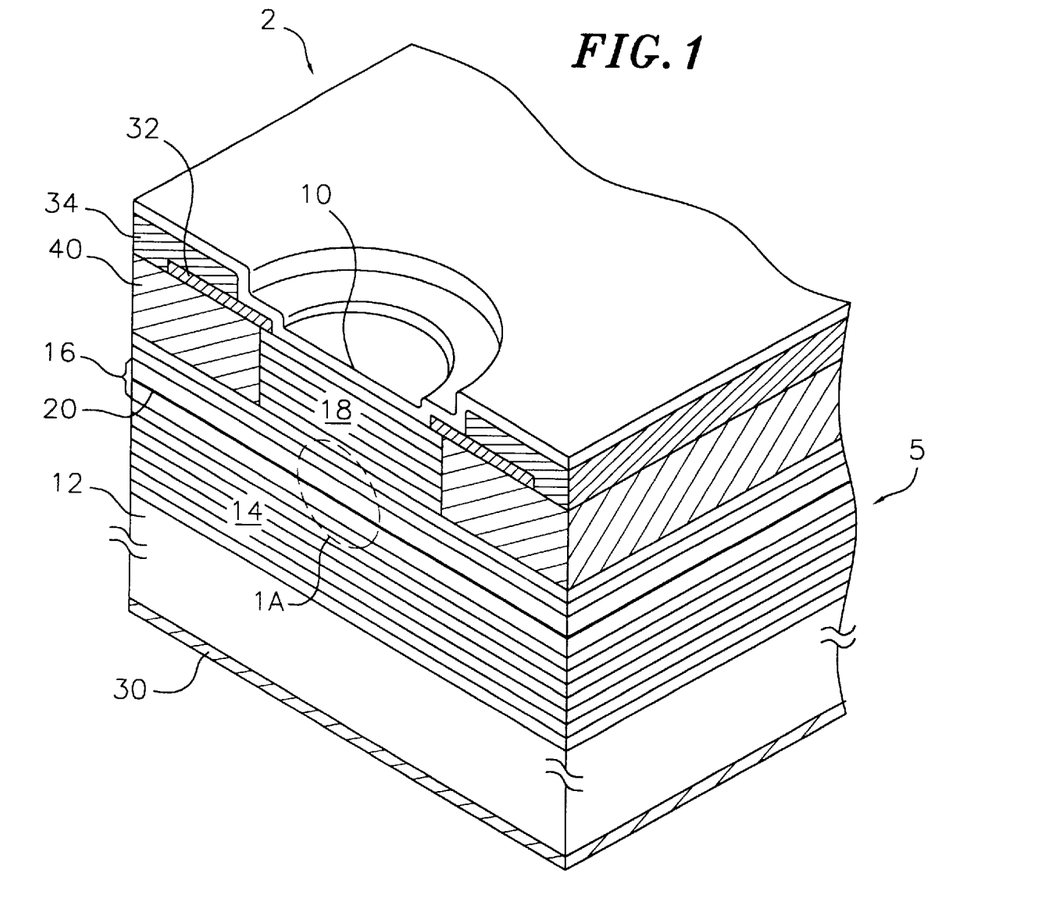
FIG. 1 is a perspective view, partly in cross section, of a VCSEL with variable tuning layer according to an embodiment of the present invention.

Referring to FIG. 1, a VCSEL 2 with variable tuning layer according to an embodiment of the present invention generally includes a conventional VCSEL portion 5 and a variable tuning layer 10 having a thickness predetermined in an intermediate process step to achieve a laser with a desired slope efficiency. Advantageously, the present invention can be used with virtually any conventional VCSEL design, an exemplary embodiment of which is described herein.

The exemplary conventional VCSEL portion 5 includes a substrate 12, a first or lower mirror 14, an optical cavity 16, and a second or upper mirror 18. The substrate 12 is made of gallium arsenide (GaAs) or any other suitable material. The first and second mirrors are comprised of multilayered distributed Bragg reflectors (DBRs), as is conventional in the art. In the exemplary embodiment, aluminum gallium arsenide (AlGaAs) with varying concentrations of aluminum and gallium are used to fabricate the mirrors. The optical thickness of each mirror layer is typically designed to be a quarter wavelength of the emitted light of the laser where the optical thickness is given by the product of the physical thickness and the index of refraction.

Figure 1A:
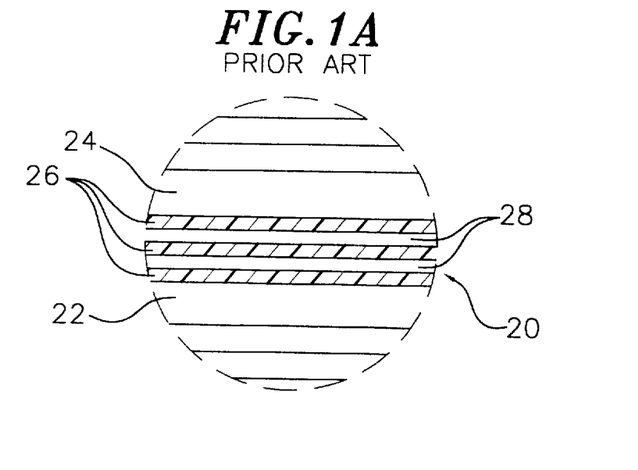
FIG. 1A is a cross sectional view of an exemplary active region of a conventional VCSEL portion of the VCSEL with variable tuning layer of FIG. 1.

The conventional optical cavity 16 (FIG. 1A) includes an active region 20 surrounded by first and second cladding regions 22, 24. The first and second cladding regions are made of AlGaAs in the exemplary embodiment. In the active region, three quantum wells 26 made of GaAs are disposed adjacent barrier layers 28 made of $Al_{0.25}Ga_{0.75}As$. As is generally understood, the number of and materials forming the quantum wells and surrounding barrier layers can be varied depending on the design.

The epitaxial structure is preferably formed into discrete lasers by a combination of current confinement and ohmic contacts. The contact metalization forming n-ohmic contact on the bottom of the substrate may be, for example, eutectic gold germanium deposited by electron beam evaporation or sputtering. The top contact metalization forming p-ohmic contact 32 may be, for example, gold with 2% beryllium added or a layered structure of titanium/platinum/gold, preferably deposited by electron beam evaporation. Current constriction is preferably provided by using proton implantation region 40 to convert the upper mirror DBR 18 to high resistivity in all areas except the active device, isolating the devices into individual VCSELs while in wafer form. Other techniques for current constriction, such as selective AlAs oxidation, are also applicable. A probe pad metalization 34 is preferably disposed onto the p ohmic contact 32 to provide for wire bonding and electrical testing.

According to the present invention, the variable tuning layer 10 is preferably disposed on the conventional VCSEL structure 5 to tune the slope efficiency and thereby compensate for manufacturing variations. The variable tuning layer may be made of any optically transparent, mechanically stable material. In a preferred embodiment, the variable tuning layer is formed of a dielectric layer of a silicon oxide or silicon nitride, whose thickness is chosen to center the slope efficiency distribution of the lasers on a wafer to compensate for wafer to wafer variation in the slope efficiency.

The thickness of the variable tuning layer is preferably in the range from about zero to about one quarter wavelength, or multiples thereof, for yielding a final surface reflection that can be continuously varied from in phase to out of phase with the adjacent DBR. The term "surface reflection" is meant to have an ordinary meaning as known in the art, and is further meant to cover any reflections on surfaces (e.g., air, plastic, or a plurality of layers comprising an additional Bragg reflector), relating to a top layer and/or one or more intermediate layers. In practice, the phases of all reflections above the variable tuning layers are changed relative to the layers below the variable tuning layer. In the preferred embodiment, the tuning layer 10 has the effect of altering the top facet reflectivity of the VCSEL in a predictable manner, thereby adjusting the slope efficiency of the overall device, and enabling the production of a plurality of lasers having consistent slope characteristics from different wafers.

Figure 2:
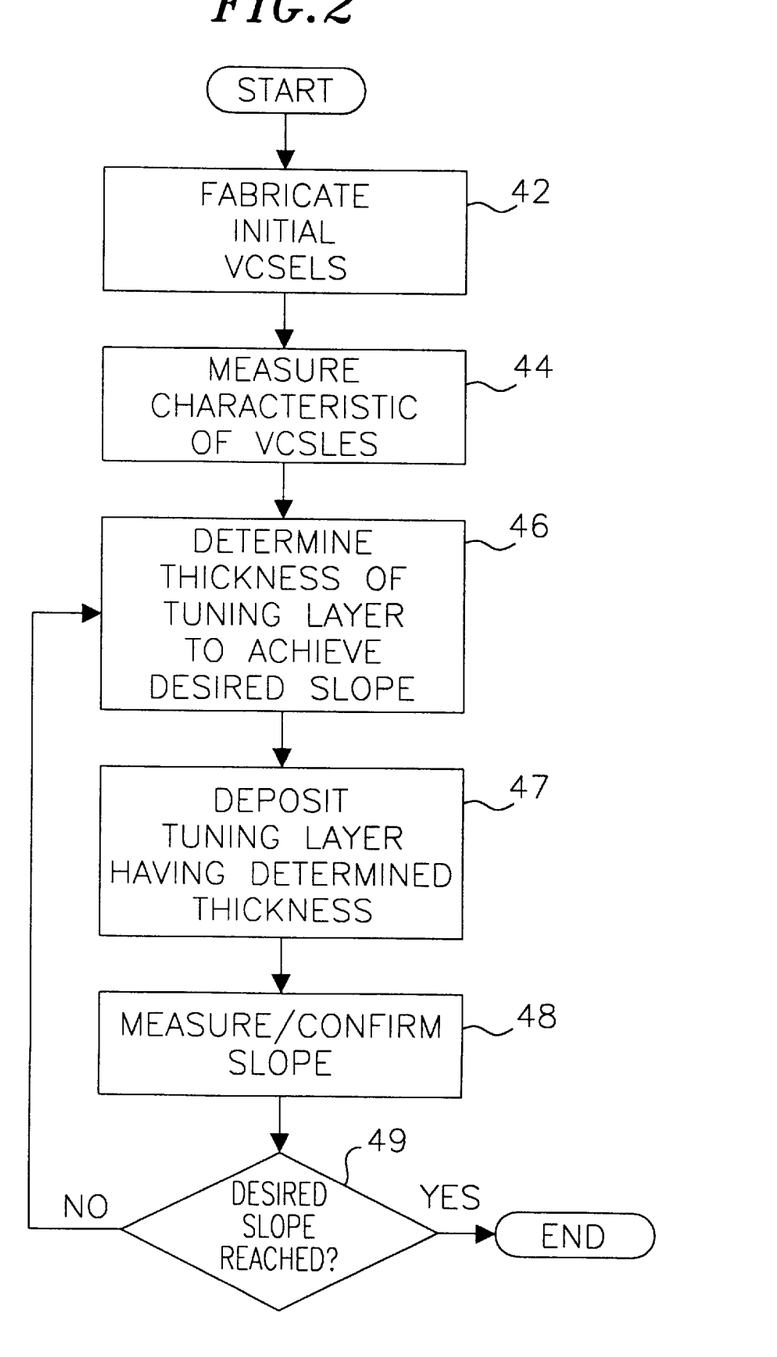
FIG. 2 is a flow diagram for a process of manufacturing the VCSEL with a variable tuning layer of FIG. 1.

Referring also to FIG. 2, the VCSEL with variable tuning layer 2 is preferably manufactured according to a process that includes the steps of fabricating 42 the initial VCSEL portion; measuring 44 a characteristic of the initial VCSEL portion 5, such as its resistance or slope efficiency; determining 46 the thickness of the variable tuning layer 10 based on the measured characteristic necessary to change the slope of the laser to a desired value; and depositing 47 a variable tuning layer 10 having the determined thickness to produce a laser with the desired slope. After measurement of the resulting slope 48, the determining and depositing steps can be repeated 49 if necessary to fine tune the lasers to the desired slope. Each of the steps is described in more detail hereinafter.

Figure 3:
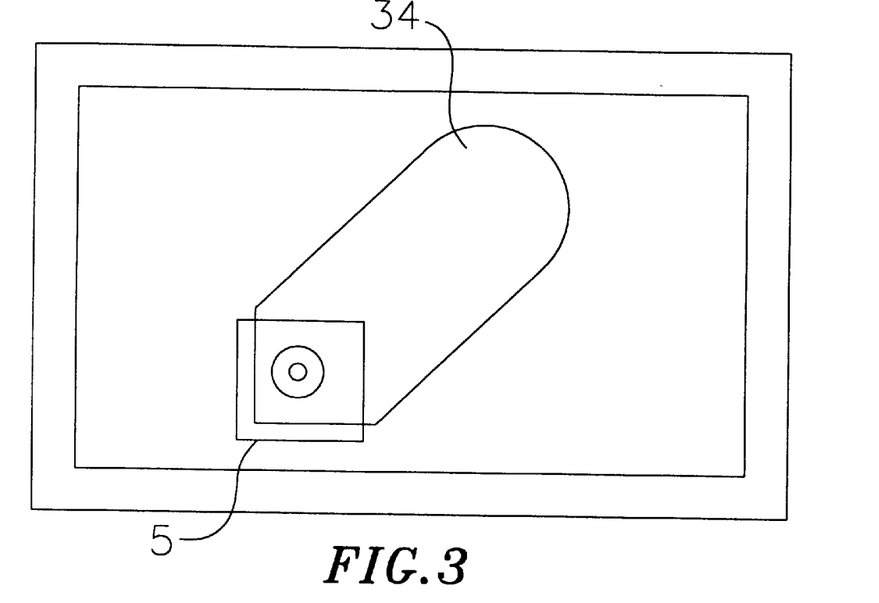
FIG. 3 is a top plan view of a conventional VCSEL with a probe pad for enabling efficient testing.
Figure 4:
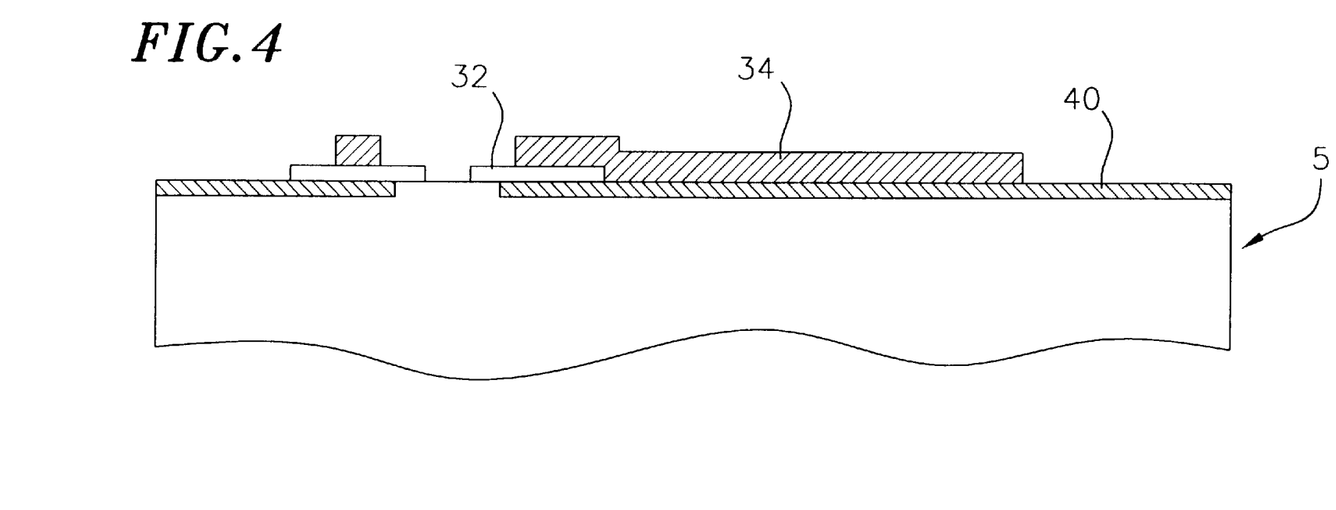
FIG. 4 is a cross-sectional side view of the VCSEL of FIG. 3.

As shown in FIGS. 3 and 4, in a presently preferred embodiment, the VCSEL with variable tuning layer is made by initially fabricating a wafer 50 of conventional VCSEL portions 5 leaving the surfaces of the VCSELs, which may include dielectric passivation layers, exposed. The various layers of the VCSELs are epitaxially deposited on the semiconductor substrate following techniques well known in the art. One such technique is described in U.S. Pat. No. 4,949,350, the contents of which are hereby incorporated by reference. To facilitate testing, a probe pad 34 is placed on the devices on the wafer to make a contact for electrical testing and subsequent wire bonding of the completed lasers.

Figure 5:
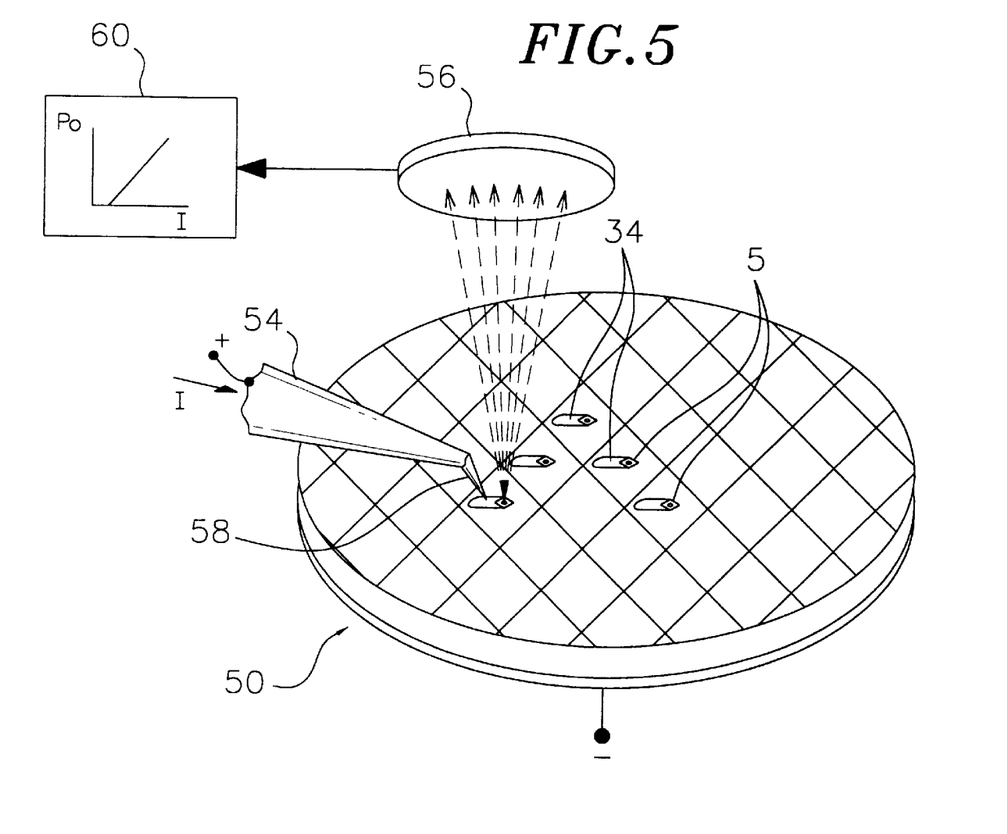
FIG. 5 is a diagram of a wafer comprising discrete VCSELs that are being tested to determine slope efficiency distribution.

Once the conventional VCSEL portions 5 are fabricated, one or more characteristics of the initial lasers, such as resistance or slope efficiency, for example, is measured directly or indirectly by any conventional method. In the preferred embodiment, the measuring step is carried out as shown in FIG. 5 by placing the wafer 50 on a grounded chuck (not shown) of a conventional autoprober 54 which is preferably modified by any suitable technique to include the disposition of a broad area photodetector 56 above the probe tip 58. The probe tip is then moved into physical contact with probe pad 34 on the initial VCSEL portions 5, enabling electrical testing.

The process of measuring the slope efficiency of the initial VCSELs 5 is preferably performed by determining the ratio of the change in laser optical output power produced by a change in the input bias current. This can be accomplished, for example, by stepping the applied bias current while measuring the optical output power with the photodetector to generate a current to light characteristic 60. In one method of calculation, the light characteristic is searched for the low current $I_{min}$ that produces a specified low level optical power $P_{min}$. The high current $I_{op}$ is then calculated by adding a specified modulation current $I_{mod}$ to $I_{min}$ such that:

$$I_{op}=I_{min}+I_{mod}. \tag{I}$$

The corresponding high level optical power $P_{op}$ is determined from the measured characteristic, and the slope efficiency $\eta_{ext}$ is calculated by $$\eta_{ext}=(P_{op}-P_{min})/(I_{mod}) \tag{II}$$

The low level power $P_{min}$ and modulation current $I_{mod}$ are preferably chosen to be representative of the conditions used in the higher level assemblies. Other conventional methods such as linear regression may be used to calculate slope efficiency as is known in the art.

The measurement of slope efficiency is preferably made on a representative sample of VCSELs to capture the slope efficiency distribution for the wafer. For example, in a typical VCSEL layout, some 20,000 devices may be formed on a three inch wafer. A representative sample may be on the order of 200 devices, for example, spatially distributed on a regular grid over the wafer surface.

Once the slope efficiency has been determined, the next step in the preferred embodiment is to modify the optical efficiency of the laser in order to achieve the desired slope efficiency. The slope efficiency $\eta_{ext}$ of a laser is the product of the internal efficiency $\eta_i$ and the optical efficiency $\eta_{opt}$.

$$\eta_{ext}=\eta_i\eta_{opt} \tag{III}$$

The internal efficiency $\eta_i$ is the fraction of electrons that are converted to photons while the optical efficiency $\eta_{opt}$ is the fraction of photons that are transmitted out of the laser. As shown in equation (III), adjusting the optical efficiency $\eta_{opt}$ so that the product is constant can compensate for variations in the internal efficiency.

The optical efficiency $\eta_{opt}$ is calculated as the ratio of the transmission to the sum of the transmission and optical losses, $$\eta_{opt}=T/(T+L) \tag{IV}$$

where T is the transmission out of the cavity where the light is generated to the output facet, and L is the sum of all other losses including transmission out the other side of the laser.

In practice, the transmission is modified by the variable tuning layer which alters the top facet reflectivity of the laser. Accordingly, the optical efficiency, and hence the slope, becomes adjusted. While the internal efficiency ordinarily varies in an unpredictable fashion, the change in transmission of the VCSEL as additional layers are deposited is highly predictable. Once the slope efficiency of the VCSEL has been measured, the internal efficiency for that wafer is essentially fixed, so the transmission can be tuned to compensate.

The thickness of the variable tuning layer 10 to achieve the desired slope is preferably determined in the following manner. A ratio is first calculated between the measured slope efficiency to the desired value, and then a predetermined lookup table, described in more detail below, is referenced which relates the slope efficiency ratio to a tuning layer thickness. The desired values of slope efficiency for the VCSELs may be based, for example, on specifications for the VCSELs or specifications for, or tests conducted on, higher level assemblies.

Figure 6:
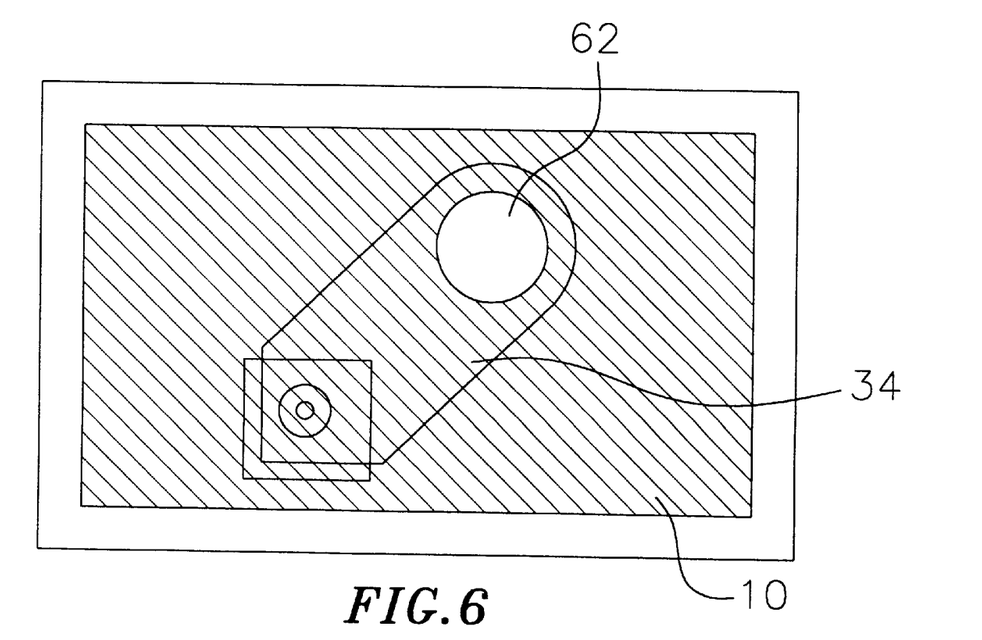
FIG. 6 is a top plan view of a VCSEL with a variable tuning layer having an etched surface for enabling contact with the probe pad for additional testing.

Referring to FIGS. 5 and 6, once the variable tuning layer 10 is deposited onto the initial VCSEL 5, via holes 62 are preferably etched to the probe pad 34 to provide a contact for further electrical testing. The representative sample lasers are preferably retested to confirm the effectiveness of the variable tuning layer. The tuning process may then be repeated, if needed, taking into account the tuning layer thickness already on the wafer. In practice, the tuning during the first quarter wavelength is monotonic, and therefore error in thickness is made on the low side to enable recovery from deviations by additional deposition rather than etching, although etching may be used if needed. Furthermore, the yield is preferably optimized by centering the wafer's distribution within a specification, so the above process is preferably applied to center the distribution and maximize yield.

Figure 8:
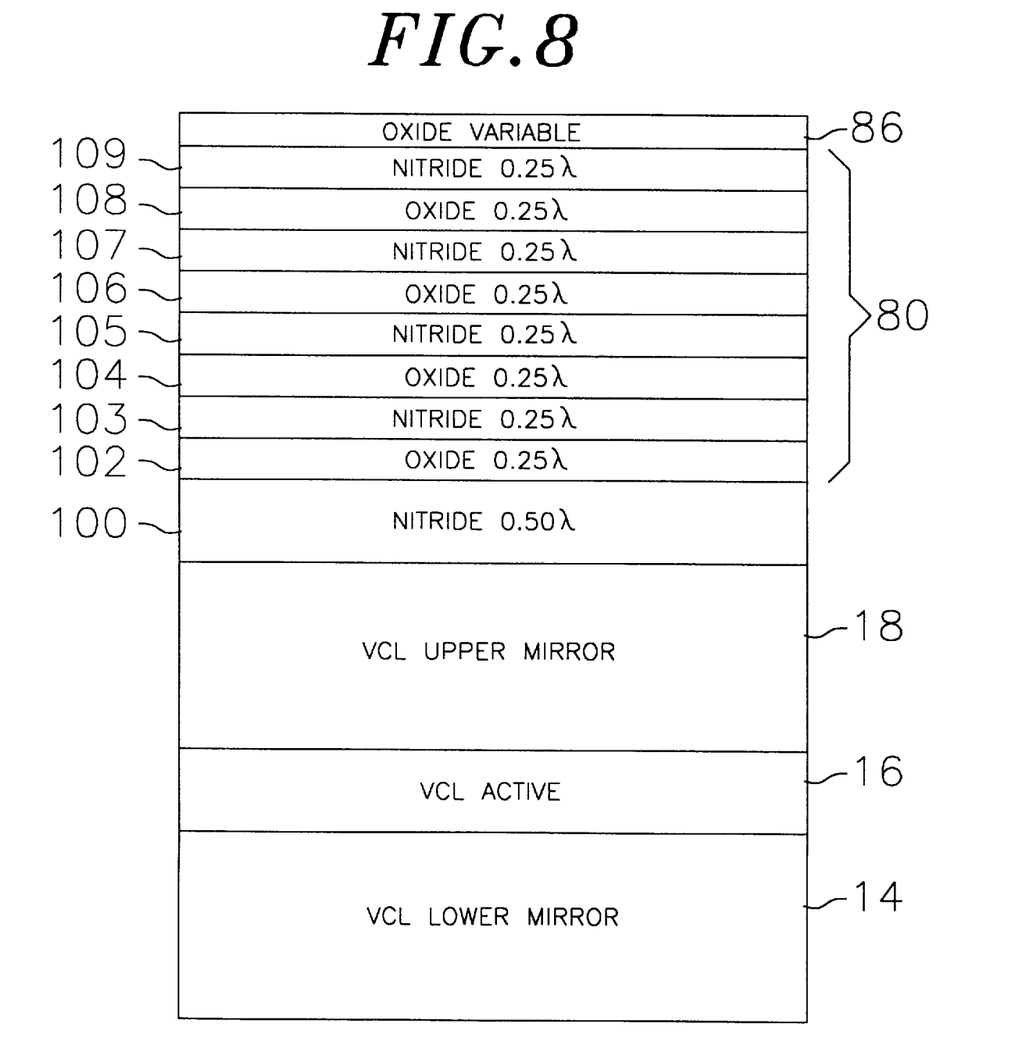
FIG. 8 is a block diagram of the layers of a distributed Bragg layer and variable tuning layer disposed on a conventional VCSEL according to a presently preferred embodiment of the present invention to adjust the laser slope efficiency.

Referring to FIG. 8, in an alternate and presently preferred embodiment of the present invention, an additional process step is introduced after the testing step to coarsely tune the slope of the initial VCSELs 5 toward the desired range, and then fine tune the slope of the lasers to the desired range. This step is generally accomplished by disposing a matching layer 100 and an additional Bragg stack 80 over the upper mirror to reduce the slope to an initial level, and then disposing an additional tuning, or dephasing, layer 86 over the Bragg stack to move the slope to the desired level.

In the preferred embodiment, the matching layer is a one half wavelength silicon nitride layer 100, followed by four alternating pairs of one quarter wavelength silicon oxide 102, 104, 106, 108 and silicon nitride layers 103, 105, 107, 109, configured as the additional DBR 80. As is conventional in the art, the layer thicknesses are computed using the wavelength as measured in the material, so that the nitride layers with a higher index of refraction have a smaller absolute thickness than the oxide layers with a lower index of refraction. The thicknesses are preferably chosen to ensure that all reflections add completely in-phase relative to the original VCSEL upper mirror 18 reflection. The dephasing layer 86 is a variable-thickness oxide layer whose thickness is in the range of from about zero to about one quarter wavelength, or multiples thereof, to yield a final reflection which can be continuously varied from in phase to out of phase with the preceding reflections. As the thickness of the layer increases from zero, the reflection becomes progressively more out of phase and the total transmission out of the VCSEL is increased.

Figure 9:
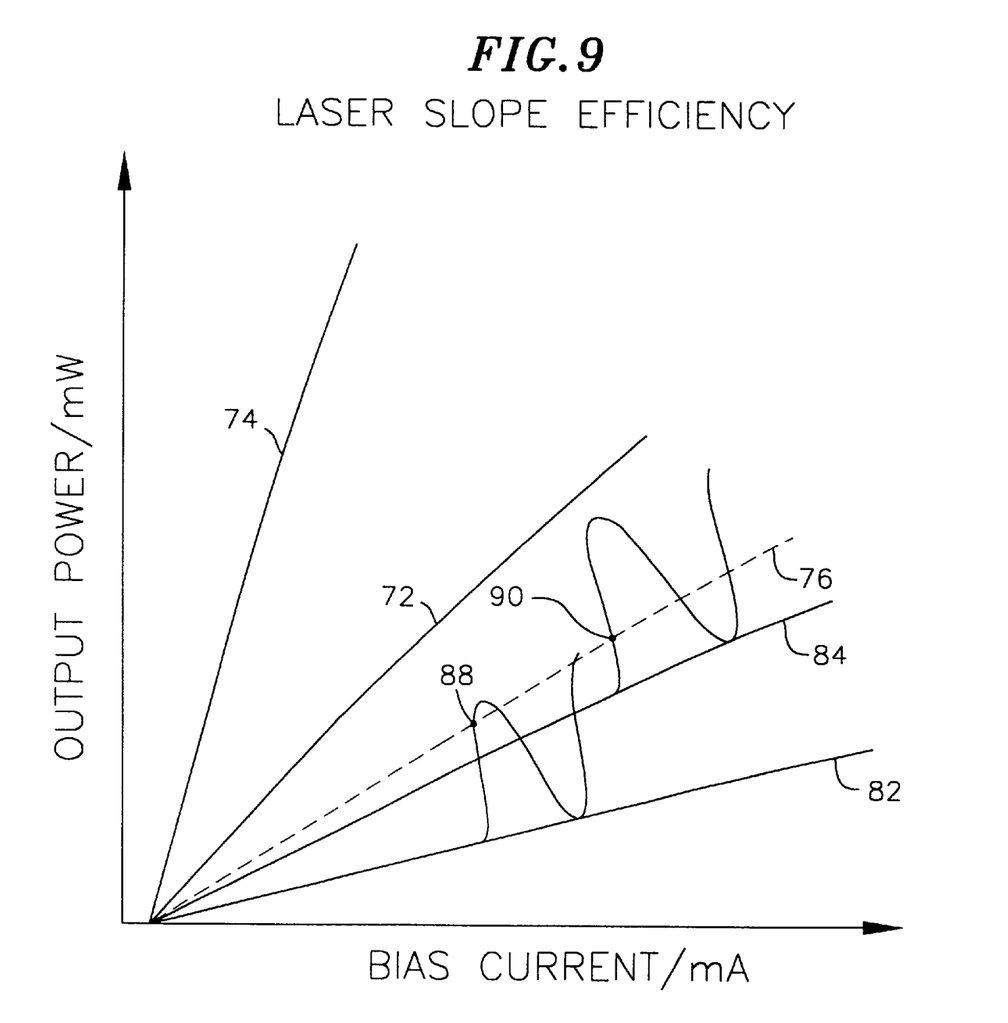
FIG. 9 is a graph of laser slope efficiencies for lasers fabricated from two different wafers, which shows differences in the slope efficiencies of lasers fabricated from different wafers and the reduced variation after tuning.

Referring to FIG. 9, the preferred process for fabricating VCSELs with consistent slopes from a plurality of wafers is disclosed by graphical illustration. Through the measuring step, tests conducted on initial lasers from two different wafers prior to the tuning process show that the wafers have substantially different slope efficiency distributions centered as shown in curves 72 and 74. Both distributions are preferably greater than the desired efficiency 76, which is preferably set at the center of the specified distribution. The presently preferred process is to deposit the four period DBR 80 (FIG. 8) over the upper mirror to reduce the slope efficiencies for the wafers below the specified range as shown in curves 82 and 84, and then to deposit the wafer specific predetermined silicon dioxide tuning layer 86 (FIG. 8) to tune the slope efficiencies for the lasers on each of the wafers toward the desired value as shown in curves 88 and 90. As shown in FIG. 9, the tuning layer increases the transmission until it reaches an optical thickness of one quarter wavelength, and then the transmission is reduced to a minimum at a thickness of one half wavelength. The tuning is thus cyclical with layer thickness, oscillating with each half wavelength deposition. In another embodiment, one could start with two wafers as represented by curves 82, 84 and then increase the transmission by applying either silicon oxide or silicon nitride tuning layers as shown in curves 88 and 90.

In practice, a look up table such as in Table 1 is used in the preferred embodiment to determine the third DBR stack and thickness of the variable tuning layer to move the slope efficiency toward the center of the specification. As is shown in the "scaled" column, the tuning in the exemplary embodiment provides a 2× range (0.221/0.113) in the final slope efficiencies.

TABLE 1

Exemplary Lookup Table for an 850 nm VCSEL Including a Four Period Dielectric DBR and a Variable Oxide Tuning Layer (calculated up to a quarter wave optical thickness)

| VCL structure | Oxide (D) | Trans | Loss | η opt | scaled |
|---|---|---|---|---|---|
| initial | no mirror | 0.256 | 0.3 | 0.461 | 1.000 |
| 4 periods + | 0 | 0.017 | 0.3 | 0.052 | 0.113 |
| 4 periods + | 200 | 0.017 | 0.3 | 0.053 | 0.115 |
| 4 periods + | 400 | 0.018 | 0.3 | 0.056 | 0.122 |
| 4 periods + | 600 | 0.020 | 0.3 | 0.063 | 0.136 |
| 4 periods + | 800 | 0.023 | 0.3 | 0.071 | 0.155 |
| 4 periods + | 1000 | 0.027 | 0.3 | 0.083 | 0.180 |
| 4 periods + | 1200 | 0.032 | 0.3 | 0.096 | 0.209 |
| 4 periods + | 1400 | 0.034 | 0.3 | 0.102 | 0.221 |

The ratio of the center of the specified distribution to the median of the measured slope efficiency distribution is referred to in the "scaled" column of Table 1. The corresponding value for the oxide tuning layer thickness is then selected from the "oxide" column of Table 1. For example, if a slope efficiency distribution of an initial VCSEL wafer is centered on a value of 0.44 mW/mA, and the desired center for the distribution is 0.06 mW/mA, then the ratio is 0.06/0.44=0.136 and the oxide thickness to be deposited is preferably 600 angstroms, according to the exemplary table.

Figure 7:
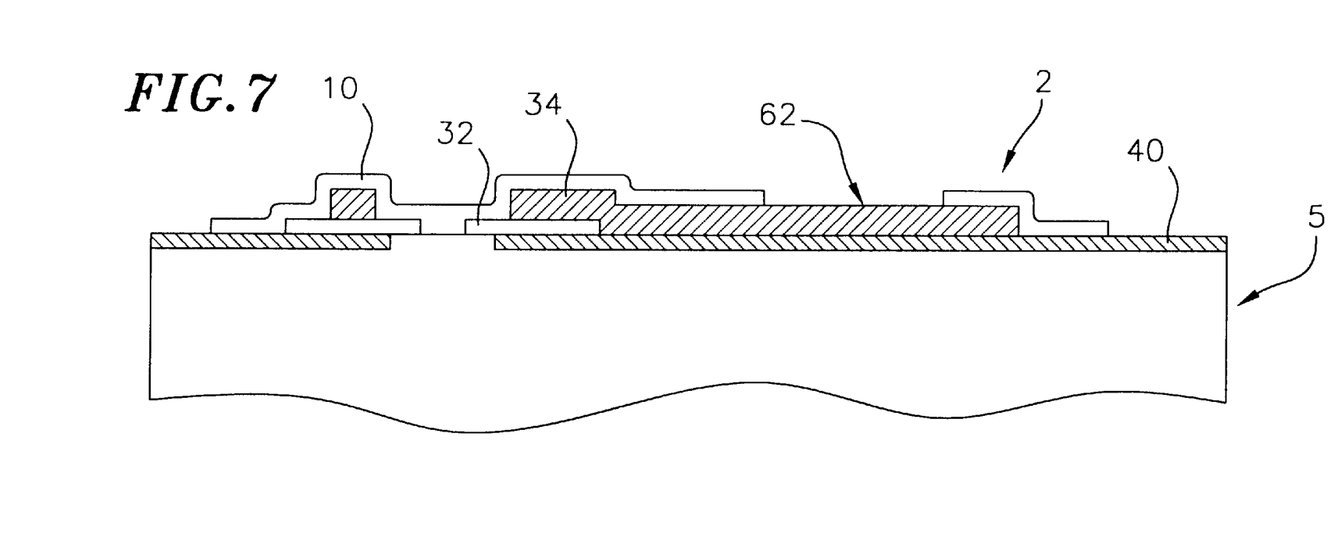
FIG. 7 is a cross-sectional side view of the VCSEL of FIG. 6.

In the preferred embodiment, the additional Bragg stack 80 and tuning layer 86 are deposited using plasma enhanced chemical vapor deposition. As is conventional in the art, such optically transparent films can be routinely deposited in increments below 50 angstroms. In addition, an adhesion layer, such as titanium, is preferably deposited onto any exposed gold surfaces prior to dielectric deposition to enable good mechanical stability of the dielectric mirror and tuning layer. The titanium layer, typically on the order of a 100 angstroms thick, may be deposited by any suitable method, such as by sputtering or electron beam evaporation. Once the dielectric mirror and tuning layer have been deposited, the film is preferably patterned and etched to create via holes (e.g., 62, FIGS. 6 and 7) for electrical contact. The patterning and via etching may be accomplished using conventional photolithography techniques to mask the films and plasma etching using any suitable reactive gas such as $CF_4/O_2$. With the additional mirror and tuning layer complete, the lasers may be retested, if desired, by any suitable method to confirm that the process achieved the desired result.

In the event the slope falls away from target, more material may be added if the slope needs to be increased, or material may be etched off if the slope needs to be decreased. For example, if the retest of a device were to produce a slope efficiency of 0.053 mW/mA instead of the desired 0.06 mW/mA, an additional deposition may be used to increase the transmission further. The ratio of the specified slope efficiency to the measured value is calculated as described above, but the "scaled" column is preferably normalized to the value corresponding to the current tuning layer thickness, a value of 0.136 in the example of a 600 angstrom layer. Accordingly, the desired ratio would 0.06/0.053=1.13. This is achieved according to the table by adding an additional 200 angstroms, as the ratio of the scaled column entries for 800 and 600 angstroms is 0.155/0.136=1.14, approximately the desired value. The process for tuning the slope efficiency is thus completed.

The lookup table may be determined by calculation, empirical data, or any other suitable method. To determine the table empirically, any suitable procedure may be used. In practice of a presently preferred method, a conventional VCSEL wafer is processed to a testable level, and a representative sample of lasers is tested to determine the slope efficiency. Subsequently, a third mirror comprising any desired number of DBRs (including none) is deposited, followed by a partial deposition of the tuning layer. Vias are etched in the dielectric tuning layer to enable testing, and the same sample is retested. The procedure is preferably repeated until a complete quarter-wave thickness of tuning layer has been deposited. The data for the median device provides a table of slope efficiency vs tuning layer thickness for the device. Normalizing the slope efficiency data by the initial value produces the "scaled" column in Table 1.

Alternatively, to determine the table by calculation, the transmission from the cavity out of the VCSEL surface can be calculated using conventional transmission matrices, such as those generally described in Scott, J. W., "Design, Fabrication and Characterization of High-Speed Intra-Cavity Contacted Vertical-Cavity Lasers", University of California, Santa Barbara, Electrical and Computer Engineering Technical Report #95-06, June 1995, the contents of which are hereby incorporated by reference, or by any other suitable technique known in the art. The calculation is applied to various tuning layer thicknesses, producing the data in the "T" column of Table 1.

In the exemplary table set forth above, the power transmission T and round trip optical loss L are expressed in percent. The transmission is the fraction of power transmitted out of the cavity on a single reflection, while the optical loss represents the fractional power loss as a wave makes one complete round trip propagation within the cavity. The optical loss is a combination of internal losses that arise predominantly from free carrier absorption as well as transmission out the lower mirror DBR stack. In exemplary Table 1, the optical loss L is presumed constant wafer to wafer and generally remains constant for a given wafer. It can also be estimated using the transmission matrix formalism, or can be determined experimentally by correlating a set of experimental slope efficiency measurements with the theoretical prediction. Once the transmission T and optical loss L have been determined, the values for the optical efficiency $\eta_{opt}$ are calculated using equation IV. To produce the scaled data, the values of $\eta_{opt}$ are normalized to the initial $\eta_{opt}$ value.

A second order effect that may be taken into account is that the transmission out of the lower mirror varies depending on the accuracy of the VCSEL growth relative to the design. These variations can usually be ignored, but may be important to consider if the growth thickness accuracy is highly variable, which may occur in some VCSEL manufacturing processes. In this case, a refinement of the described tuning process preferably includes modification of the optical loss values. The optical loss values to be used may be correlated with spectral measurements of the initial VCSEL or dynamic fits of optical loss value to agree with the change in slope observed upon the application of an intermediate dielectric deposition and test step.

Figure 10:
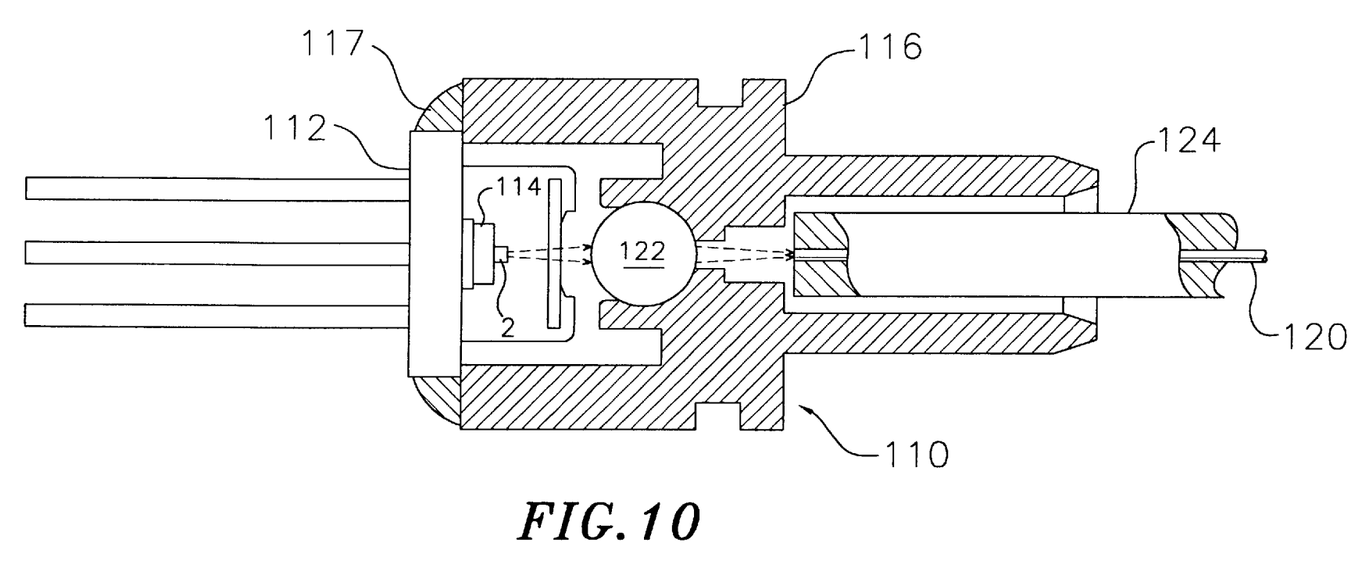
FIG. 10 is a side view, partly in cross-section, of an optical subassembly incorporating the VCSEL with variable tuning layer according to the present invention.

FIG. 10 illustrates the VCSEL with variable tuning layer 2 mounted into an optical subassembly (OSA) 110. The OSA enables application of DC biasing and AC modulation signals to the VCSEL. With the exception of the VCSEL 2, all of the parts of the OSA are conventional. The OSA generally comprises an electrical package 112 containing the VCSEL 2 and a power monitoring photodetector 114. The electrical package is preferably bonded to a precision molded plastic housing 116. The bonding process including conventional bonding material 117 preferably involves active alignment to optimize the coupling of the laser light into an optical fiber 120, as is conventional in the art. The OSA includes a ball lens 122 for coupling the light into the optical fiber. A ferule 134 provides alignment of the optical fiber. After the electrical package 112 and housing 116 are bonded together, the fiber is removed and the OSA 125 is complete. An exemplary optical subassembly is also described in U.S. patent application Ser. No. 08/900,507, filed Jul. 25, 1997, now abandoned, the contents of which are hereby incorporated by reference.

By obtaining a more accurate slope for the VCSEL 2, more toleration for mechanical variances in the OSA, and in the higher level assemblies is permissible. These mechanical variances may include, for example, variations in concentricity from fiber to fiber, sub optimal active alignment variations, shifts in mechanical position due to environmental changes such as temperature, and normal connector tolerances to allow insertion of a fiber into the housing. Allowing, increased mechanical variation reduces manufacturing complexity and increases yield, thereby resulting in lower overall product cost. Alternatively, the mechanical tolerances may be maintained at current levels to yield an OSA with more consistent performance characteristics.

Figure 11:
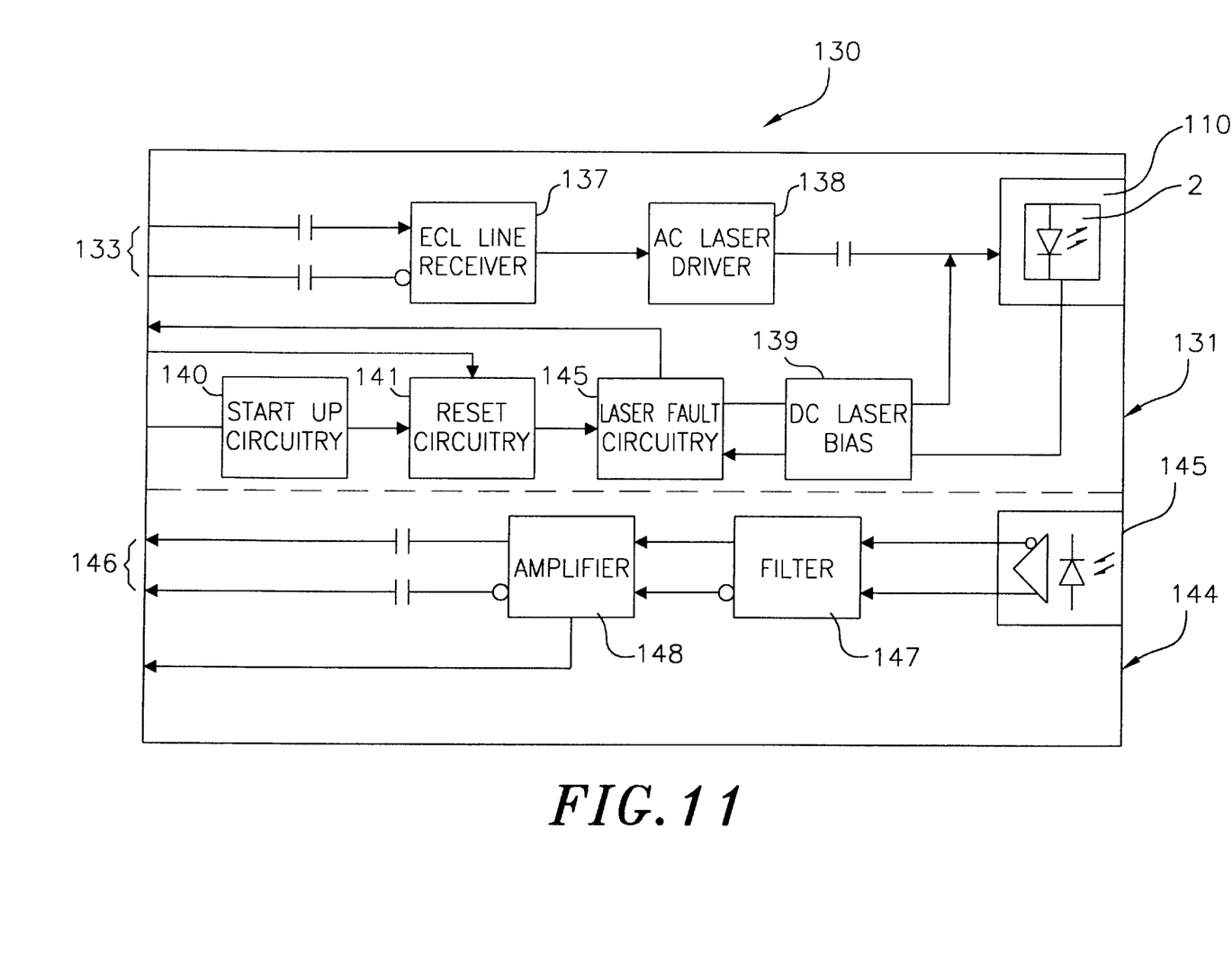
FIG. 11 is a block diagram of an optical transceiver incorporating the optical subassembly of FIG. 10.

FIG. 11 illustrates in block diagram form an optical transceiver 130 incorporating a VCSEL with variable tuning layer 2 fabricated according to the inventive method. With the exception of the VCSEL 2 all of the parts of the optical transceiver are conventional. The transceiver includes a transmitter portion 131 and a receiver portion 144. The transmitter portion provides an interface between a differential input 133 and an optical fiber output. In operation, a differential input signal is converted to a single ended signal by emitter coupled logic (ECL) line receiver 137 and an AC modulation signal is applied to the single ended signal in laser driver 138. A DC bias signal is then applied to the signal by DC laser bias signal generator 139 for application to the OSA 110. Start up circuitry 140 and reset circuitry 141 is preferably provided to control the transmission of data over the optical fiber. A laser fault indicator 145 provides a status indication of the transmitter portion 131.

The receiver portion 144 takes an input from an optical fiber provided through a photodetector 145 and converts it to a differential output signal. The receiver pre amp signal is preferably low pass filtered in filter 147 to remove any high frequency noise present, amplified in amplifier 148 to regenerate the digital signal, and then transmitted off the board through the differential output 146.

The use of VCSELs with highly consistent slopes in optical transceivers enhances the performance and reliability of the data communications system. This is because the total optical subassembly slope variation can be effectively tuned to fall within specification, so the drive circuit will not have to be used to compensate. Such a system will not suffer from changes in high speed performance, and will therefore have the desirable effect of generally improving overall product consistency and yield.

Although a preferred embodiment of the present invention has been described, it should not be construed to limit the scope of the appended claims. Those skilled in the art will understand that various modifications may be made to the described embodiment. For example, the steps may be performed in different order than listed in the claims, and additional steps may be added to further tune the process. The variable tuning layer need not be the final layer on the VCSEL, but may include other layers over it, including a plurality of variable tuning layers separated by conventional or other layers. VCSELs may be constructed to operate at various wavelengths, such as but not limited to the telecommunications windows of 1200 to 1600 nanometers and 780 to 860 nanometers as well as the visible wavelengths of 400 to 710 nanometers. Furthermore, the VCSEL with variable tuning layer may be used in any application of surface emitting lasers requiring substantially consistent slopes simply by appropriately adjusting the optical thickness.

What is claimed is:

1. A method for manufacturing a surface emitting laser with a desired slope, the method comprising the steps of:

fabricating a laser having an optical efficiency;

measuring a characteristic of the laser; and changing the optical efficiency of the laser based on the measured characteristic to adjust slope of the laser toward the desired slope.

2. The method of claim 1 wherein the measuring step comprises measuring the slope of the initial laser.

3. The surface emitting laser of claim 1 wherein the laser emits light at a wavelength in the range from about 780 nm to about 860 nm.

4. The method of claim 3 wherein the fabricating step comprises the step of fabricating laser having an 850 nm nominal wavelength.

5. The surface emitting laser of claim 1 wherein the laser emits light at a wavelength in the range from about 1200 nm to about 1600 nm.

6. The surface emitting laser of claim 1 wherein the laser emits light at a wavelength in the range from about 350 nm to about 700 nm.

7. The method of claim 1 wherein the fabricating step comprises the steps of disposing first and second mirrors on a substrate defining a laser cavity, and wherein the changing step comprises changing phase of reflection between the second mirror and a final facet of the laser.

8. The method of claim 1 wherein the changing step comprises depositing a distributed Bragg reflector over the second mirror to provide a first adjustment of the optical efficiency and then depositing an optically transparent layer for changing phase of surface reflection to provide a second adjustment of the optical efficiency.

9. The method of claim 8 wherein the depositing an optically transparent layer for changing phase of surface reflection to provide a second adjustment of the optical efficiency.

10. The method of claim 1 wherein the changing step comprises the steps of:
   disposing a silicon nitride layer phase matched to the second mirror;
   disposing a distributed Bragg reflector over the silicon nitride layer, wherein the distributed Bragg reflector comprises alternating layers of silicon oxide and silicon nitride; and
   disposing an additional non-quarter wavelength silicon oxide layer over the distributed Bragg reflector.

11. A method for fabricating surface emitting lasers having substantially similar slopes from a plurality of wafers, the method comprising the steps of:
   fabricating a plurality of surface emitting lasers on a wafer;
   testing a sample of the lasers to determine slope efficiency distribution of the lasers on the wafer; and
   changing transmission of the lasers on the wafer by an amount calculated to tune the slope efficiency distribution of the lasers to within a predetermined range.

12. The method of claim 11 further comprising the step of performing the fabricating, testing and changing steps on lasers made from a second wafer to produce lasers from different wafers within the predetermined range.

13. The method of claim 11 wherein the fabricating step comprises the steps of:
   disposing a first multilayer mirror on a substrate;
   forming an optical cavity adjacent the first mirror;
   disposing a second multilayer mirror over the optical cavity;
   disposing first and second contacts for providing current to the lasers;
   forming discrete lasers on the wafer; and
   disposing a probe pad adjacent one of the contacts to facilitate testing of the lasers.

14. The method of claim 11 wherein the step of testing the lasers comprises determining ratio of change in optical output power produced by a change in input bias current applied to the laser.

15. The method of claim 11 wherein the testing step comprises stepping the applied bias current while measuring the optical output power to generate a current to light characteristic.

16. The method of claim 11 wherein the changing step comprises the steps of:
   determining thickness of a variable tuning layer for changing the transmission of the laser by the calculated amount; and
   disposing a variable tuning layer having the determined thickness to adjust phase of top facet reflectivity of the laser.

17. The method of claim 16 wherein the determining step comprises reading the thickness of the variable tuning layer from a table of values correlating the measured characteristic of the initial laser to the thickness of the variable tuning layer needed to adjust the slope efficiency distribution to within the predetermined range.

18. The method of claim 16 wherein the determining step comprises computing the thickness of the variable tuning layer using a transmission matrix.

19. The method of claim 11 further comprising the steps of determining the slope efficiency distribution of the lasers after the transmission has been changed, and further changing the transmission of the lasers to adjust the slope efficiency distribution toward center of the predetermined range.

20. The method of claim 19 wherein the step of determining the slope efficiency distribution of the lasers after the transmission has been changed comprises the steps of etching a via to access a probe pad to facilitate electrical testing.

21. The method of claim 11 wherein the changing step comprises the steps of:
   disposing a distributed Bragg reflector over the second mirror to reduce the slope to below the predetermined range; and
   disposing a non-quarter wavelength tuning layer over the distributed Bragg reflector, wherein the combination of the change in transmission caused by the distributed Bragg reflector and tuning layer adjusts the slope efficiency distribution of the lasers on the wafer to within the predetermined range.

22. A surface emitting laser comprising:
   a substrate;
   a first mirror disposed on the substrate;
   an optical cavity adjacent the first mirror;
   a second mirror having a top facet reflectivity disposed adjacent the optical cavity opposite the first mirror; and
   a tuning layer for predictably changing the top facet reflectivity by an amount based on values predetermined to adjust slope of the laser to within a desired range.

23. The surface emitting laser of claim 22 wherein the tuning layer comprises a non-quarter wavelength layer of optically transparent material deposited over the second mirror.

24. The surface emitting laser of claim 23 wherein the optically transparent material comprises silicon oxide.

25. The surface emitting laser of claim 23 wherein the optically transparent material comprises silicon nitride.

26. The surface emitting laser of claim 23 wherein the optically transparent material comprises a combination of silicon oxide and silicon nitride.

27. The surface emitting laser of claim 23 wherein the tuning layer further comprises a distributed Bragg reflector disposed between the second mirror and tuning layer.

28. The surface emitting laser of claim 27 wherein the distributed Bragg reflector comprises alternating layers of oxides and nitrides.

29. The surface emitting laser of claim 25 wherein the tuning layer further comprises a layer of optically transparent material phase matched to the upper mirror and disposed between the second mirror and the distributed Bragg reflector.

30. The surface emitting laser of claim 29 wherein the layer of optically transparent material phase matched to the upper mirror comprises a one half wavelength layer of silicon nitride.

31. The surface emitting laser of claim 22 wherein the laser emits light at a wavelength in the range from about 780 nm to about 860 nm.

32. The surface emitting laser of claim 22 wherein the laser emits light at a wavelength in the range from about 1200 nm to about 1600 nm.

33. The surface emitting laser of claim 22 wherein the laser emits light at a wavelength in the range from about 350 nm to about 700 nm.

34. A plurality of surface emitting lasers having substantially similar slopes fabricated from first and second wafers, each of the lasers comprising:
a substrate;
a first mirror disposed on the substrate;
an optical cavity adjacent the first mirror;
a second mirror having a top facet reflectivity disposed adjacent the optical cavity opposite the first mirror; and
wherein the lasers on the first wafer further comprise a first tuning layer having a first tuning layer thickness over the second mirror, and the lasers on the second wafer have a second tuning layer having a second tuning layer thickness over the second mirror, and wherein the first tuning layer thickness substantially differs from the second tuning layer thickness.

35. The surface emitting lasers of claim 34 wherein the first and second tuning layers comprise silicon oxide.

36. The surface emitting lasers of claim 34 wherein the first and second tuning layers comprise silicon nitride.

37. The surface emitting lasers of claim 34 wherein at least one of the wafers comprises a non-quarter wavelength tuning layer.

38. An optical subassembly comprising:
an electrical package containing a VCSEL with variable tuning layer and a photodetector for monitoring power of the VCSEL;
a housing attached to the electrical package, the housing including a ball lens aligned in an optical path carrying light from the VCSEL into an optical fiber, and a ferule for aligning the optical fiber in the optical path; and
wherein the VCSEL is tuned to enable the optical subassembly to perform within a specification, and wherein the VCSEL comprises:
a substrate;
a first mirror disposed on the substrate;
an optical cavity adjacent the first mirror;
a second mirror having a top facet reflectivity disposed adjacent the optical cavity opposite the first mirror; and
a tuning layer for predictably changing the top facet reflectivity by an amount based on values predetermined to adjust slope of the laser to within a desired range.

39. The apparatus of claim 38 wherein the tuning layer comprises a non-quarter wavelength layer of optically transparent material deposited over the second mirror.

40. The apparatus of claim 39 wherein the optically transparent material comprises silicon oxide.

41. The apparatus of claim 39 wherein the optically transparent material comprises silicon nitride.

42. The apparatus of claim 39 wherein the optically transparent material changes phase of surface reflectivity of the VCSEL.

43. The apparatus of claim 39 wherein the tuning layer further comprises a distributed Bragg reflector disposed between the second mirror and tuning layer.

44. The apparatus of claim 39 wherein the distributed Bragg reflector comprises alternating layers of oxides and nitrides.

45. The apparatus of claim 44 wherein the tuning layer further comprises a layer of optically transparent material phase matched to the upper mirror and disposed between the second mirror and the distributed Bragg reflector.

46. The apparatus of claim 45 wherein the layer of optically transparent material phase matched to the upper mirror comprises a one half wavelength layer of silicon nitride.

47. The apparatus of claim 38 wherein the laser emits light at a wavelength in the range from about 780 nm to about 860 nm.

48. The apparatus of claim 38 wherein the laser emits light at a wavelength in the range from about 1200 nm to about 1600 nm.

49. The apparatus of claim 38 wherein the laser emits light at a wavelength in the range from about 350 nm to about 700 nm.

50. An optical transceiver comprising:
a transmitter portion including:
an optical subassembly containing a VCSEL with a variable tuning layer;
an AC laser driver coupled to the optical subassembly for applying an AC modulation signal to the VCSEL;
a DC bias circuit for applying a bias signal to the VCSEL; and
wherein the VCSEL is tuned to enable the optical transceiver perform within a specification, and wherein the VCSEL comprises:
a substrate;
a first mirror disposed on the substrate;
an optical cavity adjacent the first mirror;
a second mirror having a top facet reflectivity disposed adjacent the optical cavity opposite the first mirror; and
a tuning layer for predictably changing the top facet reflectivity by an amount based on values predetermined to adjust slope of the laser to within a desired range.

51. The apparatus of claim 50 wherein the tuning layer comprises a non-quarter wavelength layer of optically transparent material deposited over the second mirror.

52. The apparatus of claim 51 wherein the optically transparent material comprises silicon oxide.

53. The apparatus of claim 51 wherein the optically transparent material comprises silicon nitride.

54. The apparatus of claim 51 wherein the optically transparent material comprises a combination of oxide and nitride.

55. The apparatus of claim 52 wherein the tuning layer further comprises a distributed Bragg reflector disposed between the second mirror and tuning layer.

56. The apparatus of claim 55 wherein the distributed Bragg reflector comprises alternating layers of oxides and nitrides.

57. The apparatus of claim 56 wherein the tuning layer further comprises a layer of optically transparent material phase matched to the upper mirror and disposed between the second mirror and the distributed Bragg reflector.

58. The apparatus of claim 57 wherein the layer of optically transparent material phase matched to the upper mirror comprises a one half wavelength layer of silicon nitride.

59. The apparatus of claim 51 wherein the laser emits light at a wavelength in the range from about 780 nm to about 860 nm.

60. The apparatus of claim 51 wherein the laser emits light at a wavelength in the range from about 1200 nm to about 1600 nm.

61. The apparatus of claim 51 wherein the laser emits light at a wavelength in the range from about 350 nm to about 700 nm.

* * * * *

UNITED STATES PATENT AND TRADEMARK OFFICE
CERTIFICATE OF CORRECTION

PATENT NO.    : 6,160,834
DATED         : December 12, 2000
INVENTOR(S)   : Jeffrey W. Scott It is certified that error appears in the above-identified patent and that said Letters Patent is hereby corrected as shown below:

<u>Column 14,</u>
Line 43, replace "claim 52" with -- claim 51 --.

Signed and Sealed this

Twenty-first Day of May, 2002

Attest:

Attesting Officer

JAMES E. ROGAN
*Director of the United States Patent and Trademark Office*